United States Patent [19]

DeOrnellas

[11] Patent Number: 5,672,239
[45] Date of Patent: Sep. 30, 1997

[54] INTEGRATED SEMICONDUCTOR WAFER PROCESSING SYSTEM

[75] Inventor: Stephen Paul DeOrnellas, Santa Rosa, Calif.

[73] Assignee: Tegal Corporation, Petaluma, Calif.

[21] Appl. No.: 438,261

[22] Filed: May 10, 1995

[51] Int. Cl.$^6$ ................................................ H01L 21/30
[52] U.S. Cl. ................... 156/625.1; 156/345; 204/298.35
[58] Field of Search ........................... 156/345; 118/719; 204/298.25, 298.35

[56] References Cited

U.S. PATENT DOCUMENTS

| | | | |
|---|---|---|---|
| 5,135,608 | 8/1992 | Okutani | 156/345 X |
| 5,171,393 | 12/1992 | Moffat | 156/345 |
| 5,376,212 | 12/1994 | Saiki | 156/345 |

*Primary Examiner*—Thi Dang
*Attorney, Agent, or Firm*—Fliesler, Dubb, Meyer & Lovejoy

[57] ABSTRACT

An improved apparatus and method which offers an integral pre-strip rinse operation between etching operation and stripping operation. The present invention is designed to allow a semiconductor wafer to undergo sequential processing of dry etching, wet pre-strip rinsing, dry photoresist stripping, and wet final rinsing in a single system.

17 Claims, 6 Drawing Sheets

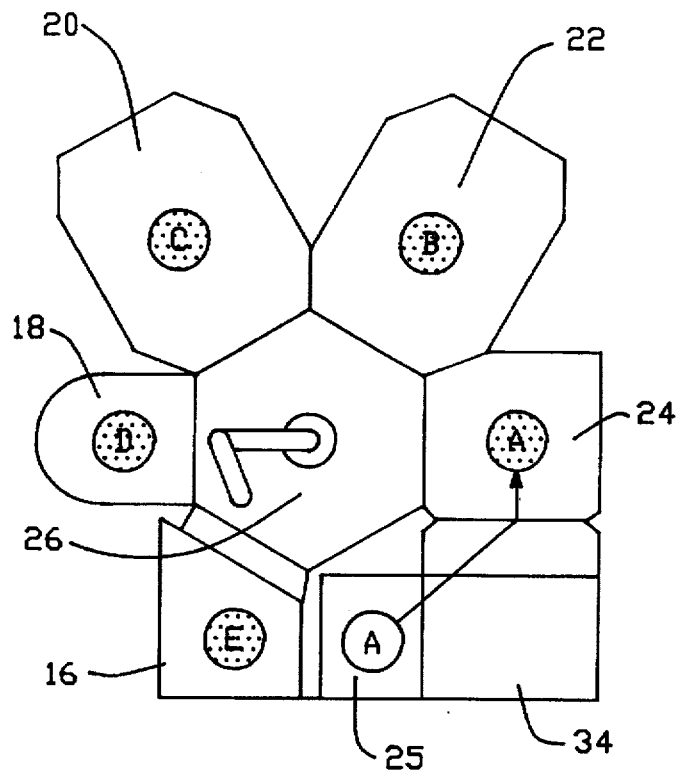
FIG.—7
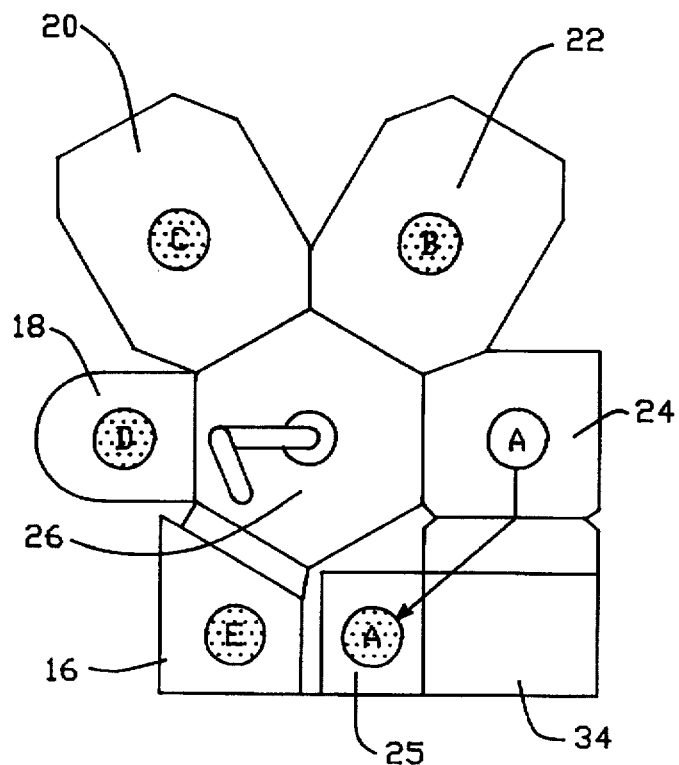
FIG.—8

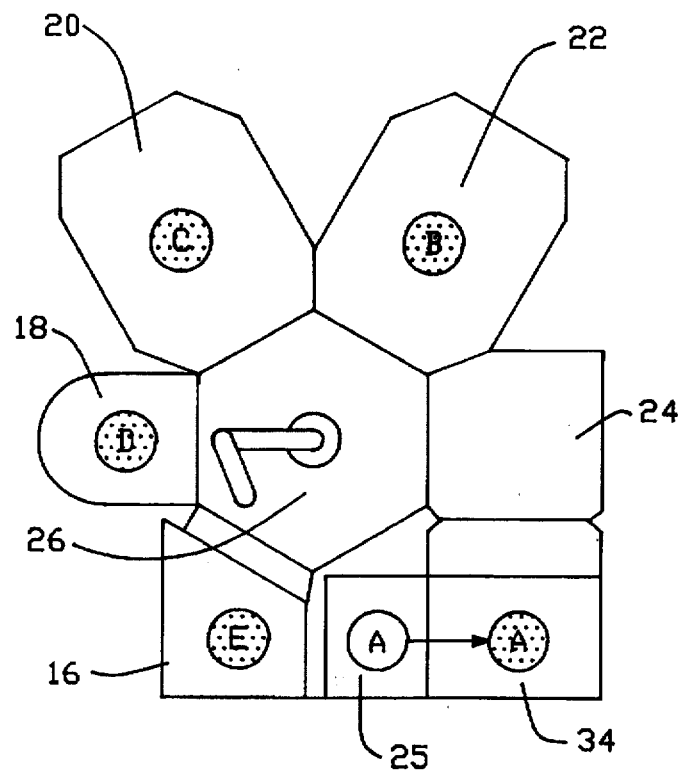
FIG.—9
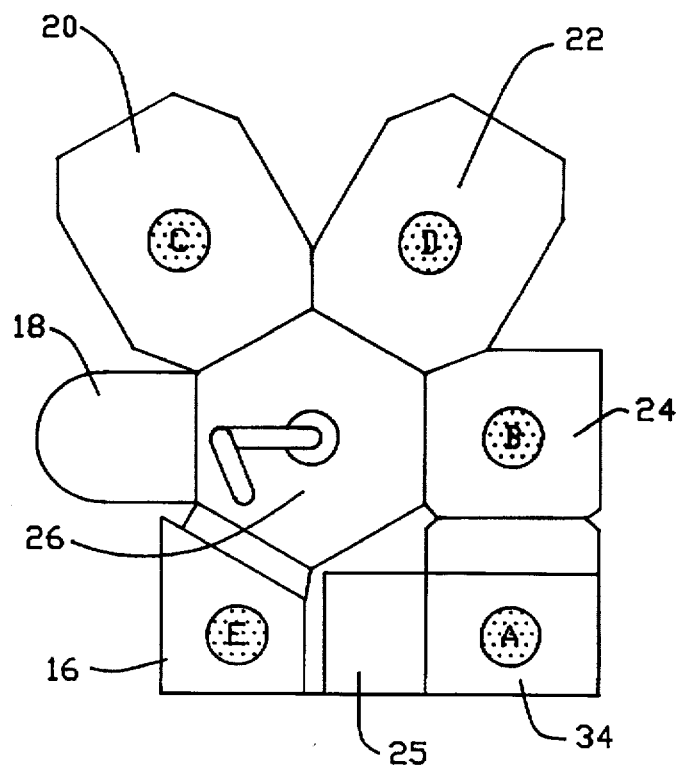
FIG.—10

INTEGRATED SEMICONDUCTOR WAFER PROCESSING SYSTEM

FIELD OF THE INVENTION

The present invention relates to a semiconductor wafer processing system and, more particularly, to an improved wafer processing apparatus and method which offers an integral post-etch pre-strip rinse operation.

BACKGROUND OF THE INVENTION

Fabrication of integrated circuits requires the formation of conductive paths interconnecting various semiconductor devices in a microchip. These conductive paths may be composed of pure metals, metal alloys, metal composites, or silicon films such as aluminum, polysilicon or tungsten silicide. In a typical process, a layer to be patterned is first deposited on a semiconductor wafer and a layer of photoresist is deposited on top of the underlying deposited layer. Patterns are then formed on the photoresist layer exposing and covering certain areas of the underlying deposited layer creating a photoresist mask. The deposited materials exposed by the open areas of the photoresist mask are conventionally removed by dry plasma etch techniques. Such a dry plasma process leaves behind residues on the photoresist mask and on the underlying deposited layer after the plasma etch. If the residues which remain on the photoresist after the metal etch step are not removed, they will cause corrosion of the underlying metal or a variety of device performance problems. Various approaches have been taken to remove residues and to prevent corrosion, none of which have been completely successful.

One solution to the corrosion and residue problems is to remove the photoresist immediately after the plasma etch step. Many wafer processing systems currently available have integrated an etch module with a photoresist strip module so that wafers can be directly transferred to a strip module for photoresist removal after etching to minimize the chance of corrosion. This practice, however, has a significant drawback. Since photoresist removal is conventionally accomplished by using an oxygen plasma, the residues that remain after the etch step, are converted into insoluble oxides in the plasma, resulting in incomplete photoresist strip, incomplete residue removal, or the need of a prolonged strip process, all of which reduce yield or throughput.

Another solution to remedy the corrosion and residue problems is to perform a pre-strip rinsing step in a solvent to remove the water soluble residues which can corrode the underlying metals before photoresist stripping and can cause other undesirable effects. However, in order to perform a pre-strip rinsing step, the wafer must be removed from the etch equipment and rinsed using separate equipment. This process of transferring the wafers between separate processing equipment not only increases overall process time, but it also increases handling and thus the chance of contaminating wafers. Furthermore, using separate equipment for the etching, photoresist stripping, and rinsing processes significantly increases the amount of space required in wafer fabrication facilities. Thus, manufacturers of integrated circuits are faced with the dilemma of either not rinsing their wafers and risking corrosion or rinsing them off-line and thus risking potential contamination and lower throughput due to increased wafer handling.

Accordingly, there is a need for a wafer processing system that allows for the sequential processing of a wafer from a dry plasma etch step to a wet pre-strip rinse step in a single system for corrosion control and residue removal.

BRIEF SUMMARY OF THE INVENTION

Broadly stated, the present invention is directed to a modular, integrated wafer processing system designed to allow a rinse operation between an etching step and a stripping step. In a preferred embodiment, a semiconductor wafer can undergo sequential processing of dry etching, wet pre-strip rinsing, dry photoresist stripping, and wet final rinsing in a single system.

The present invention provides a wafer processing system that achieves corrosion control and residue removal after a dry plasma etch by removing residues on the wafer using a rinsing step prior to photoresist stripping. The pre-strip rinsing step not only prevents corrosion, it also avoids the risk of oxidizing the residues into insoluble oxides during photoresist stripping. As a result, the time required for photoresist stripping is decreased. Furthermore, by performing a pre-strip rinsing step in the same system as the etching step, the present invention eliminates the need to bring the wafers off-line to a separate rinsing station and thus increases wafer fabrication productivity. Additionally, it reduces the total amount of wafer handling, which in turn decreases the chances of wafer contamination. The present invention also eliminates the need for having different types of equipment for etch, pre-strip rinse, photoresist strip and post strip rinse. Instead it provides a single compact, small-footprint system which performs multiple processing functions including pre-strip rinsing within a single system and thereby decreases the space needed in wafer fabrication facilities.

The advantages and objectives of the present invention will become apparent to those skilled in the art from the following detailed description of the invention, its preferred embodiments, the accompanying drawings, and the appended claims.

BRIEF DESCRIPTION OF THE DRAWINGS

FIG. 7 is a simplified top plan view of the wafer processing system of FIG. 1 wherein a wafer previously in the rinse module has been transferred back to the strip module;

FIG. 8 is a simplified top plan view of the wafer processing system of FIG. 1 wherein a wafer previously in the strip module has been transferred to the rinse module;

FIG. 9 is a simplified top plan view of the wafer processing system of FIG. 1 wherein a wafer previously in the rinse module has been transferred to an exit wafer cassette;

FIG. 10 is a simplified top plan view of the wafer processing system of FIG. 1 wherein a wafer previously in

3 an etch module has been transferred to the strip module and a wafer previously in the alignment module has been transferred to an etch module;

DETAILED OF DESCRIPTION OF PREFERRED EMBODIMENTS

Figure 1:
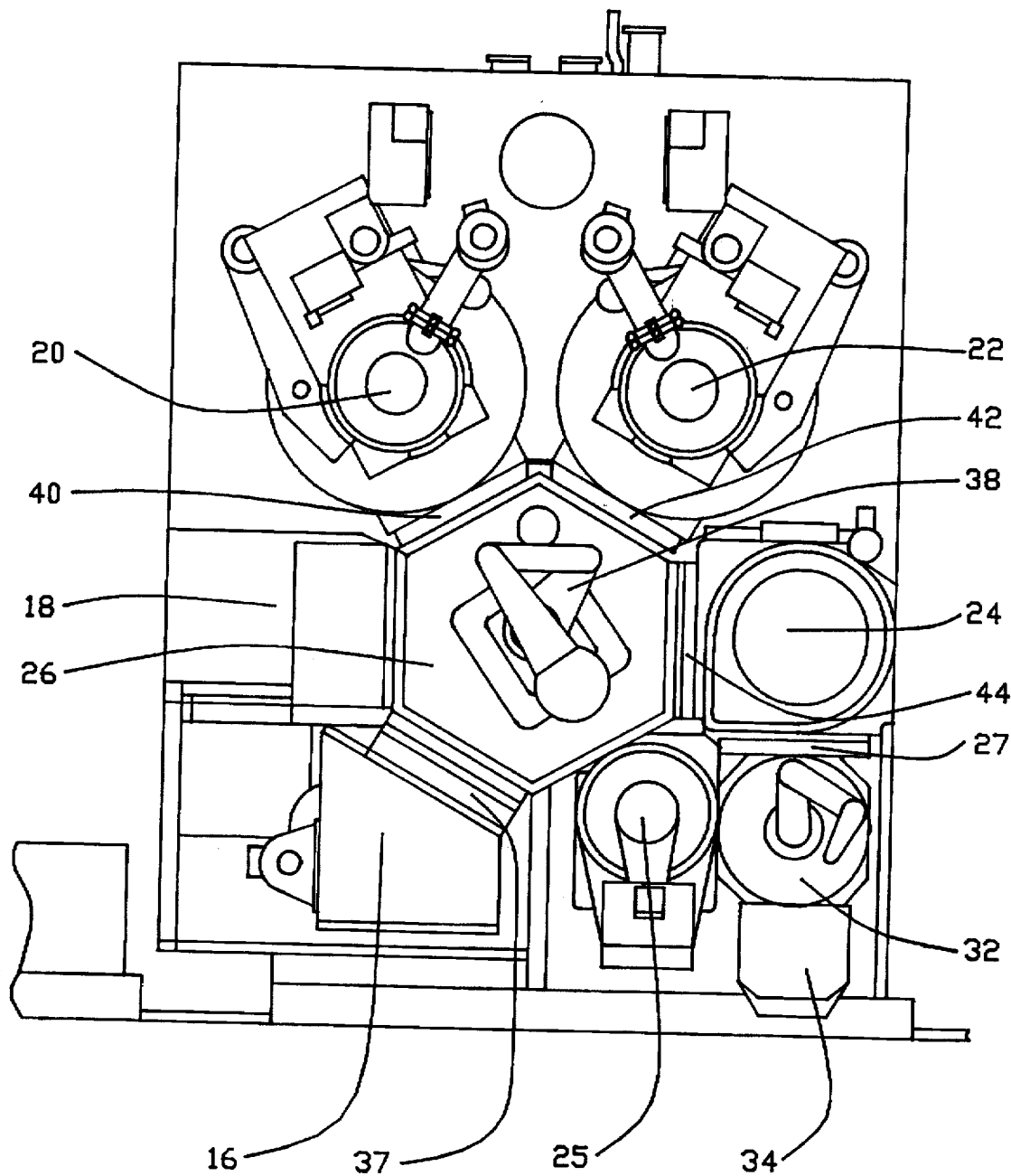
FIG. 1 is a top plan view, partially schematized, of a wafer processing system.

FIG. 1 illustrates a preferred embodiment of a system in accordance with the present invention. The system includes a vacuum load lock chamber 16, an alignment module 18, two etch modules 20 and 22, and a strip module 24, all of which are connected to a central vacuum chamber 26 through a closable opening and are operated by a computer process control system (not shown). Load lock chamber 16 houses an internal cassette elevator for holding a wafer cassette (entry cassette). Vacuum chamber 26 has a robotic wafer handling system 38 for transferring wafers from one chamber or module to another. Strip module 24 is connected to an atmospheric robotic wafer handling system 32 through a closable opening 27, which in turn is connected to rinse module 25 and atmospheric cassette module 34 (exit cassette). An example of a typical rinse module used is the Semitool Equinox rinse system. Atmospheric robotic wafer handling system 32 services the atmospheric cassette module 34 which holds wafers after the completion of processing. In addition, the second robotic wafer handling system 32 transfers wafers between strip module 24 and rinse module 25. During the rinsing process, rinse module 25 and robotic handling system 32 are designed to maintain the degree of wafer alignment required by strip module 24 for stripping. The operation of the present invention is automated and programmable through a computing system.

Figure 2:
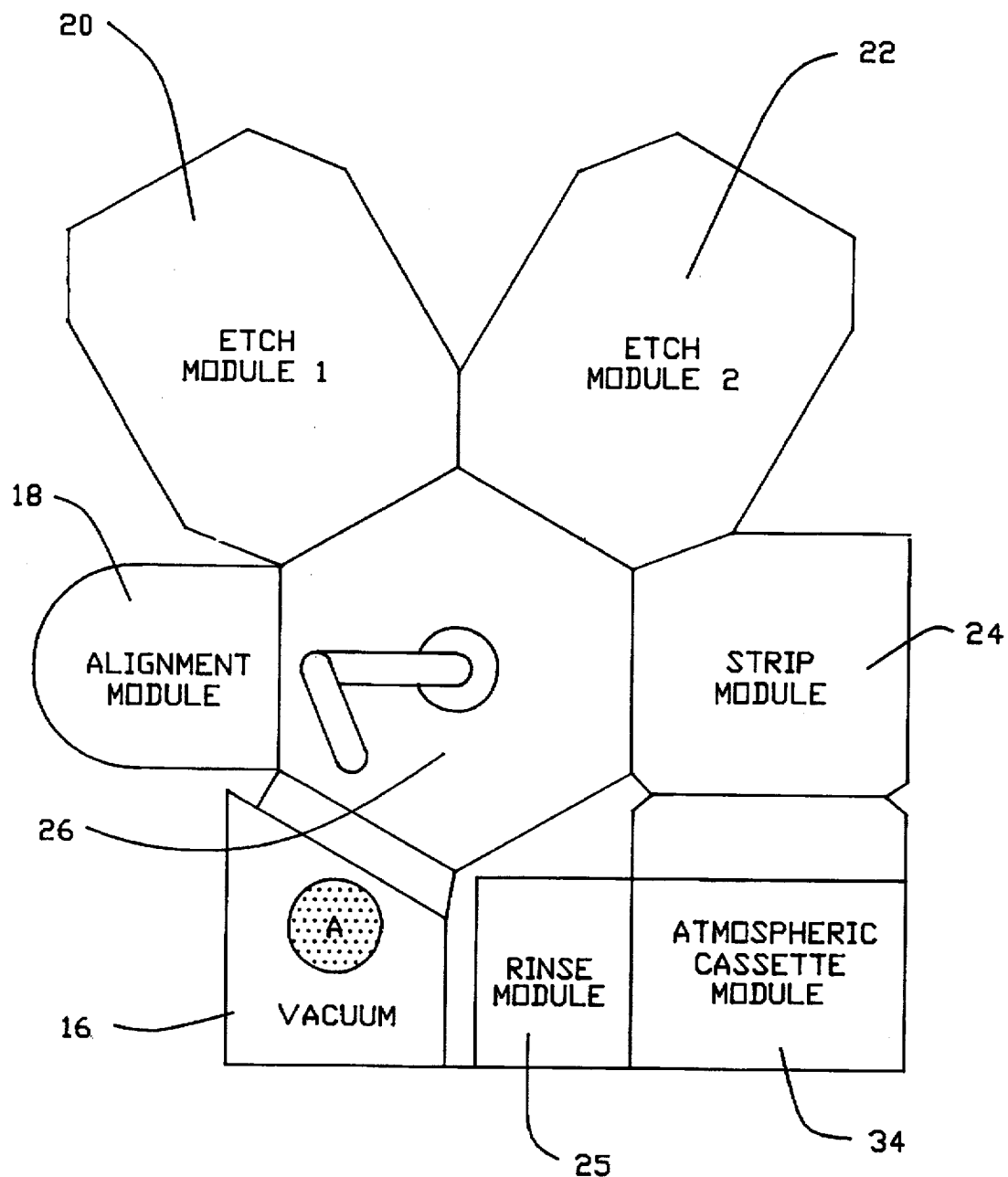
FIG. 2 is a simplified top plan view of the wafer processing system of FIG. 1 showing a wafer in the load lock chamber.
Figure 3:
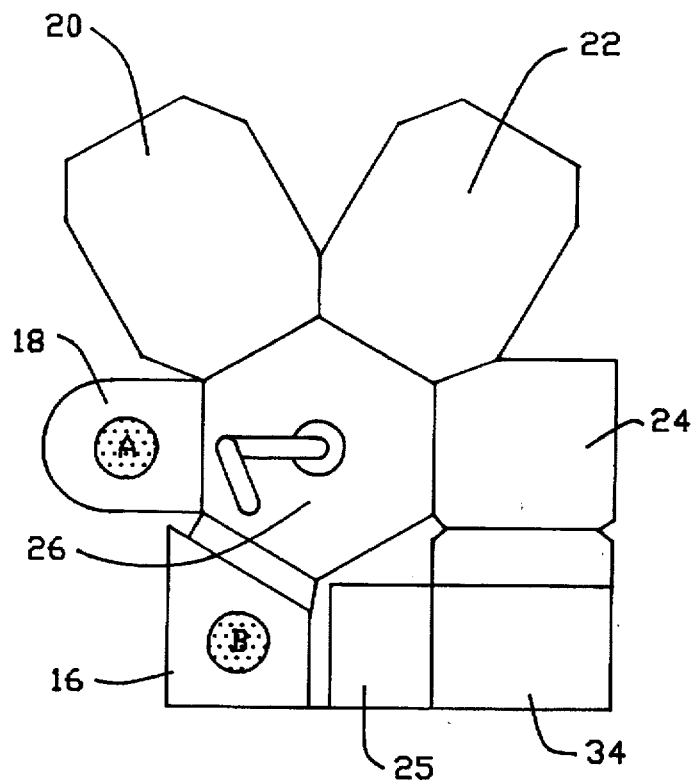
FIG. 3 is a simplified top plan view of the wafer processing system of FIG. 1 showing a wafer in the load lock chamber and a wafer in the alignment module.
Figure 4:
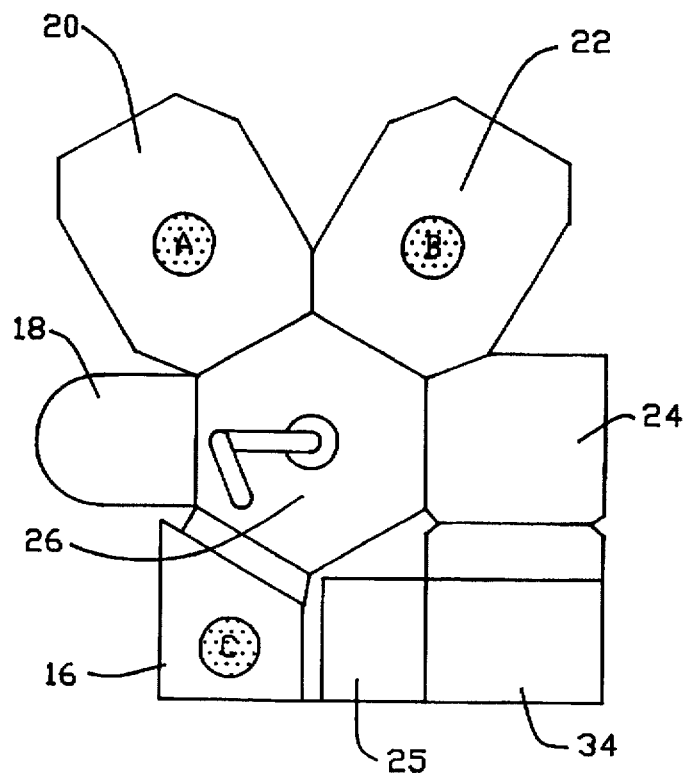
FIG. 4 is a simplified top plan view of the wafer processing system of FIG. 1 showing a wafer in the load lock chamber and a wafer in each of the two etch modules.
Figure 5:
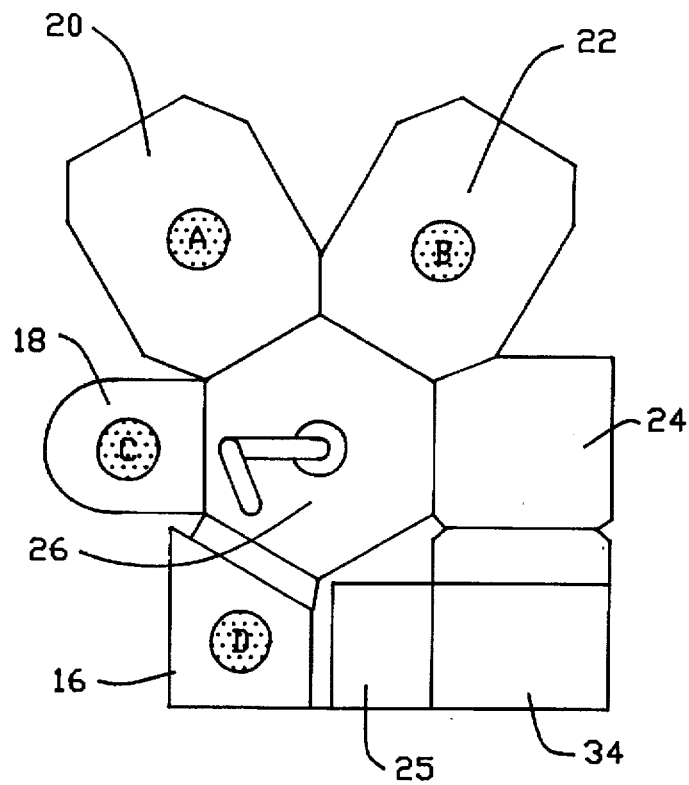
FIG. 5 is a simplified top plan view of the wafer processing system of FIG. 1 wherein a wafer previously in the load lock chamber has been transferred to the alignment module.

FIGS. 2–10 illustrate the general processing steps performed by the preferred embodiment of the invention. FIG. 2 shows a wafer that has been loaded onto a vacuum cassette elevator in load lock chamber 16. Once the load lock chamber 16 has been pumped down to vacuum, gate valve 37, situated between load lock chamber 16 and central vacuum chamber 26 opens and provides access by central robot arm 38 to the wafer cassette in load lock chamber 16. Central robot arm 38 transfers a wafer (A) from load lock chamber 16 into alignment module 18 whereby a theta alignment is performed on the wafer as illustrated in FIG. 3. The wafer is then transferred to a first etch module 20 through closable opening 40 for etching. While the first wafer is being etched in module 20, central robot arm 38 picks up a second wafer (B) from the wafer cassette in load lock chamber 16 and transfers it to alignment module 18 for theta alignment. Once the alignment is completed, wafer B is transferred into a second etch module 22 through closable opening 42 as illustrated in FIG. 4. While wafers A and B are still in the respective etch modules, the central robot arm 38 picks up a third wafer (C) from the wafer cassette in load lock chamber 16 and transfers it into alignment module 18 for theta alignment as illustrated in FIG. 5.

Figure 6:
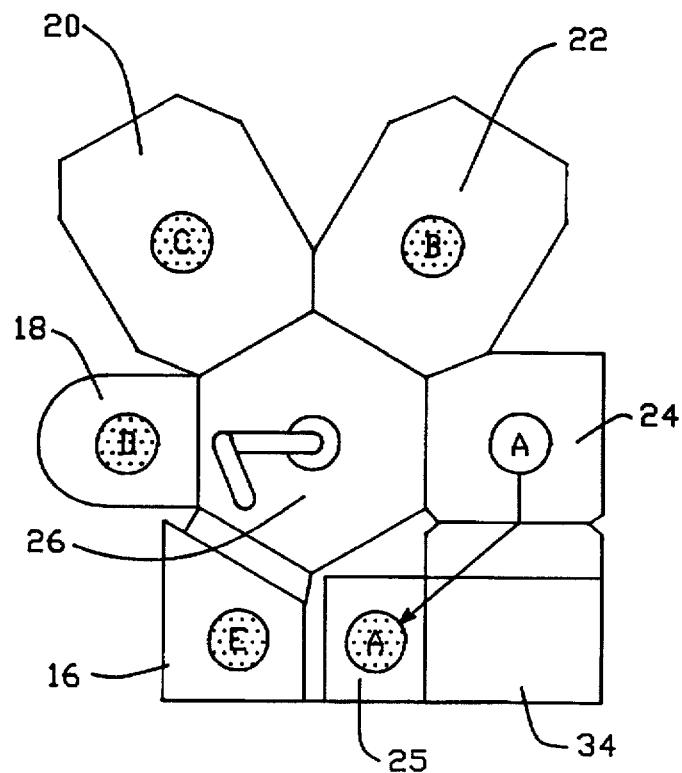
FIG. 6 is a simplified top plan view of the wafer processing system of FIG. 1 wherein a wafer previously in an etch module has been transferred to the strip module and then to the rinse module.

When the etch for the first wafer (A) is completed, central robot arm 38 removes the wafer through closable opening 40 and places it in strip module 24 through closable opening 44. No processing is performed in the strip module at this point. Once closable opening 44 is closed and sealed, strip module 24 is vented to atmospheric pressure. While strip module 24 is venting, central robot arm 38 picks up wafer C in alignment module 18 and transfers it to first etch module 20 through closable opening 40. While wafer C is being etched in first etch module 20, central robot arm 38 picks up a fourth wafer (D) from the wafer cassette in the load lock chamber and transfers it to alignment module 18 for theta alignment. Operating in parallel, once strip module 24 has been vented to atmosphere, closable opening 27 situated between atmospheric robot arm 32 and strip module 24 opens, allowing atmospheric robot arm 32 to transfer wafer A from strip module 24 to rinse module 25 as shown in FIG. 6. Wafer A then undergoes a pre-strip rinse step and a spin-dry step in rinse module 25. Once rinsing and drying is completed, atmospheric robot arm 32 transfers wafer A from rinse module 25 back to strip module 24 through closable opening 27 as illustrated in FIG. 7. After opening 27 is closed, strip module 24 is pumped down to vacuum and an oxygen plasma is used to strip the photoresist on the wafer. Once photoresist stripping is completed, strip module 24 is again vented to atmosphere. When venting is completed, atmospheric robot arm 32 transfers the wafer from strip module 24 to rinse module 25 for a final rinse and dry step through closable opening 27 as illustrated in FIG. 8. After the wafer is rinsed and dried, atmospheric robot arm 32 transfers it to exit wafer cassette 34 as illustrated by FIG. 9. This sequence of processing steps encompassing pre-strip rinse, strip, and rinse, then repeats for wafer B in second etch module 22 which is transported by central robot arm 38 through closable opening 42 and placed in strip module 24 through closable opening 44 as in FIG. 10.

While the present invention has been described in connection with specific embodiments, the present invention is not limited to such embodiments and encompasses modifications and equivalent arrangements within the scope of the appended claims. For example, while the preferred embodiment contemplates two etch modules, the benefits are obtained irrespective to the number of etch modules.

What is claimed is:

1. A method adapted for treating a semiconductor wafer in an integrated wafer processing apparatus which comprises:
   (a) a central vacuum chamber;
   (b) an etch module connected to said central vacuum chamber;
   (c) a strip module connected to said central vacuum chamber;
   (d) a rinse module, accessible to said strip module and not accessible to said central vacuum chamber;
   (e) a first transfer device that can transfer the semiconductor wafer between said rinse module and said strip module; and
   (f) a second transfer device located in said central vacuum chamber that can transport the semiconductor wafer among said central vacuum chamber, said etch module, and said strip module;
   the method comprising the steps of:
   (g) removing a material on said semiconductor wafer in said etch module of said apparatus;
   (h) transferring the semiconductor wafer with said first and second transfer devices from said etch module through said central vacuum chamber and through said strip module to said rinse module;
   (i) rinsing said semiconductor wafer in the rinse module of said apparatus subsequent to said removing step in the etch module;
   (j) transferring the semiconductor wafer back in said strip module; and
   (k) removing a mask material on the semiconductor wafer in said strip module of said apparatus; and
   (l) transferring the semiconductor wafer back to the rinse module; and
   (m) rinsing the semiconductor wafer in said rinse module subsequent to said mask removal step.

2. The method for treating a semiconductor wafer of claim 1 wherein said material removal step, said rinsing step, and said mask removal step are automated by a user-programmable computing means.

3. The method for treating the semiconductor wafer of claim 1 wherein said step of transferring said wafer between said rinse module and said strip module operates at atmospheric pressure.

4. The method for treating the semiconductor wafer of claim 1 wherein said rinse step uses various solutions.

5. The method for treating the semiconductor wafer of claim 1 wherein said rinse step also accomplishes the step of drying said semiconductor wafer.

6. The method for treating the semiconductor wafer of claim 1 wherein said rinsing steps, said transferring steps, and said removing step are automated by a user-programmable computing means.

7. A method adapted for treating a semiconductor wafer in an integrated wafer etch processing apparatus comprising the steps of:

(a) etching the semiconductor wafer in an etch module;

(b) transporting the wafer through a strip module, without performing a strip step to strip photoresist material from the wafer, to a rinse module and rinsing said semiconductor wafer prior to a photoresist layer removal step in the rinse module, wherein said rinse module is not accessible to said etch module; and (c) transporting the wafer back to the strip module and removing a photoresist layer on the semiconductor wafer in the strip module; and wherein said integrated wafer etch processing apparatus includes the etch module, the strip module and the rinse module integrated together.

8. The method for treating semiconductor wafer of claim 7 further comprising a step of:

(d) transporting the wafer back to the rinse module and rinsing said semiconductor wafer subsequent to said photoresist removing step in the strip module.

9. The method of claim 8 for treating a semiconductor wafer in the integrated wafer etch processing apparatus comprises the steps of:

dry etching the wafer in the etch module at step (a);

wet pre-strip rinsing the wafer in the rinse module at step (b);

dry photoresist stripping the wafer in the strip module at step (c); and wet final rinsing the wafer in the rinse module at step (d).

10. The method of claim 8 wherein:

said etch step (a) is performed in a vacuum; and said rinse steps (b) and (d) are performed at about atmospheric pressure.

11. A semiconductor processing system that is adapted to process a semiconductor wafer comprising:

(a) a central vacuum chamber;

(b) a vacuum load lock chamber, having at least one closable opening, connected to said central vacuum chamber;

(c) an etch module, including a reaction chamber and at least one closable opening, connected to said central vacuum chamber;

(d) a strip module, including a reaction chamber and at least one closable opening, connected to said central vacuum chamber;

(e) a rinse module, accessible to said strip module and not accessible to said central vacuum chamber;

(f) a first transfer device that can transfer the semiconductor wafer between said rinse module and said strip module;

(g) a second transfer device located in said central vacuum chamber that can transport the semiconductor wafer into and out of said central vacuum chamber and into and out of each of said load lock chamber, said etch module, and said strip module; and (h) said central vacuum chamber, said etch module, said strip module, said rinse module and said first and second transfer devices are integrated into said semiconductor system such that for semiconductor wafer to be transferred from said etch module to said rinse module, said second transfer device transfers the semiconductor wafer from said etch module through said central vacuum chamber to said strip module, and said first transfer device transfers the semiconductor wafer from said strip module to said rinse module.

12. The semiconductor processing system of claim 11 wherein said first transfer device operates at atmospheric pressure.

13. The semiconductor processing system of claim 11 wherein said strip module further comprising a resistively heated wafer chuck.

14. The semiconductor processing system of claim 11 wherein said rinse module comprises a liquid sprayer.

15. The semiconductor processing system of claim 11 wherein said rinse module comprises a dryer that can dry a semiconductor wafer.

16. A semiconductor etch processing system adapted for handling a semiconductor wafer comprising:

(a) a vacuum chamber;

(b) an etch module selectively communicable with said vacuum chamber;

(c) a strip module selectively communicable with said vacuum chamber; and (d) a rinse module, accessible to said strip module and not accessible to the vacuum chamber (e) a first transfer device that can transfer the wafer from the etch module through the vacuum chamber to the strip module:

(f) a second transfer device that can sequentially transfer the wafer (1) through and from the strip module to the rinse module so that the wafer can be rinsed, and (2) from the rinse module back to the strip module so that a photoresist layer can be removed from the wafer, and without transferring the wafer through the vacuum chamber: and (g) said vacuum chamber, said etch module, said strip module, said rinse module and said first and second transfer devices all integrated into said processing system.

17. The system of claim 16 wherein:

said second transfer device can further sequentially transfer the wafer from the strip module after a photoresist layer has been removed to the rinse module where the wafer can again be rinsed, and without transferring the wafer through the vacuum chamber.

* * * * *